(12) United States Patent
Hsu et al.

(10) Patent No.: US 10,790,367 B2
(45) Date of Patent: Sep. 29, 2020

(54) HIGH-VOLTAGE METAL-OXIDE-SEMICONDUCTOR FIELD EFFECT TRANSISTOR

(71) Applicant: CYSTECH ELECTRONICS CORP., New Taipei (TW)

(72) Inventors: Hsin-Yu Hsu, Hsinchu (TW); Chen-Huang Wang, Hsinchu County (TW)

(73) Assignee: Cystech Electronics Corp., New Taipei (TW)

( * ) Notice: Subject to any disclaimer, the term of this patent is extended or adjusted under 35 U.S.C. 154(b) by 75 days.

(21) Appl. No.: 16/354,480

(22) Filed: Mar. 15, 2019

(65) Prior Publication Data
US 2019/0288083 A1    Sep. 19, 2019

(30) Foreign Application Priority Data

Mar. 19, 2018   (TW) .............................. 107109264 A

(51) Int. Cl.
*H01L 29/40*     (2006.01)
*H01L 29/78*     (2006.01)
(52) U.S. Cl.
CPC .......... *H01L 29/408* (2013.01); *H01L 29/404* (2013.01); *H01L 29/407* (2013.01); *H01L 29/7813* (2013.01)
(58) Field of Classification Search
CPC . H01L 29/0623; H01L 29/404; H01L 29/407; H01L 29/408; H01L 29/7813
USPC ........................................................ 257/330
See application file for complete search history.

(56) References Cited

U.S. PATENT DOCUMENTS

| | | | |
|---|---|---|---|
| 5,034,341 A * | 7/1991 | Itoh .................... | H01L 27/10841 |
| | | | 257/E27.096 |
| 2002/0070418 A1* | 6/2002 | Kinzer ................ | H01L 29/0634 |
| | | | 257/496 |
| 2010/0090274 A1* | 4/2010 | Hsieh .................. | H01L 29/0878 |
| | | | 257/331 |
| 2010/0264488 A1* | 10/2010 | Hsieh .................. | H01L 29/7813 |
| | | | 257/334 |
| 2012/0299091 A1* | 11/2012 | Tsai .................... | H01L 29/7397 |
| | | | 257/334 |

* cited by examiner

*Primary Examiner* — Duy T Nguyen
(74) *Attorney, Agent, or Firm* — Wang Law Firm, Inc.

(57) ABSTRACT

A high-voltage metal-oxide-semiconductor field-effect transistor applied to a high-voltage range includes a substrate, an epitaxial layer, a plurality of first doped regions, a plurality of first trenches, a plurality of second trenches, a plurality of second doped regions, and a metal layer. The epitaxial layer is disposed on the substrate and used as a drain electrode. The plurality of first doped regions are disposed in the epitaxial layer. The plurality of first trenches are disposed on the plurality of doped regions in a spaced manner. Each of the first trenches has a first trench oxide layer and a first semiconductor layer which is connected to a source electrode. The plurality of second trenches are disposed between each of the first trenches in a spaced manner. Each of the second trenches has a second trench oxide layer and a second semiconductor layer which is connected to a gate electrode.

9 Claims, 5 Drawing Sheets

HIGH-VOLTAGE METAL-OXIDE-SEMICONDUCTOR FIELD EFFECT TRANSISTOR

CROSS-REFERENCE TO RELATED APPLICATION

This application claims priority from Taiwan Patent Application No. 107109264, filed on Mar. 19, 2018, in the Taiwan Intellectual Property Office, the content of which is hereby incorporated by reference in its entirety for all purposes.

BACKGROUND OF THE INVENTION

1. Field of the Invention

The present invention relates to a metal-oxide-semiconductor field-effect transistor, more particularly to a high-voltage metal-oxide-semiconductor field-effect transistor having trench structures and high voltage resistance.

2. Description of the Related Art

With the advancement of electronic technology and the trend of miniaturization of electronic products, more and more electronic elements are manufactured by means of integrated circuit processes. However, many aspects have to be considered in terms of electronic elements in a form of an integrated circuit, such as voltage endurance, mutual interference, or noise reduction, especially for electronic elements applied to power circuits. The power circuits receive high voltage as an input, and an input with high voltage may cause the electronic elements in a form of an integrated circuit to become damaged. This leads to the malfunction of the power circuits, which is the main reason why the size of power circuits cannot be minimized.

Wherein, metal-oxide-semiconductor field-effect transistors are often applied to these power circuits. Since the metal-oxide-semiconductor field-effect transistors are fast in operation speed and have excellent performance for voltage signal processing, the metal-oxide-semiconductor field-effect transistors may be used as converters in response to the trend of miniaturization of electronic products. There has also been a trend for the metal-oxide-semiconductor field-effect transistors to be manufactured as integrated circuits. However, when power circuits must withstand high voltage, the metal-oxide-semiconductor field-effect transistors in a form of integrated circuits may also be damaged for the same reason of not being able to withstand high voltage. Therefore, how to overcome these aforementioned shortcomings has become an issue to be addressed.

Accordingly, the inventor of the present invention has designed a high voltage metal-oxide-semiconductor field-effect transistor in an effort to tackle with deficiencies in prior art and further to enhance the implementation and application in industries.

SUMMARY OF THE INVENTION

In view of the aforementioned problems, the present invention aims to provide a high voltage metal-oxide-semiconductor field-effect transistor to solve the problems encountered in prior art.

On the basis of the purpose as mentioned above, the present invention further provides a high voltage metal-oxide-semiconductor field-effect transistor, including a substrate, an epitaxial layer, a plurality of first doped regions, a plurality of first trenches, a plurality of second trenches, a plurality of second doped regions, and a metal layer. The epitaxial layer is disposed on the substrate to be used as a drain electrode. The plurality of first doped regions are disposed in the epitaxial layer. The plurality of first trenches are respectively disposed on each of the first doped regions in a spaced manner and positioned in the epitaxial layer. Each of the first trenches has a first trench oxide layer and a first semiconductor layer. Each of the first trench oxide layers is formed on the bottom and the sidewall of each of the first trenches. Each of the first semiconductor layers fills each of the first trenches and respectively connects a source electrode. The plurality of second trenches are respectively disposed between the first trenches and positioned in the epitaxial layer. Each of the second trenches has a second trench oxide layer and a second semiconductor layer. Each of the second trench oxide layers is formed on the bottom and the sidewall of each of the second trenches. Each of the second semiconductor layers fills each of second trenches and respectively connects a gate electrode. The plurality of second doped regions are respectively disposed between each of the first trenches and each of the second trenches and positioned in the epitaxial layer. Each of the second doped regions includes a first doped layer and a second doped layer which is disposed on the first doped layer. The metal layer is disposed on the epitaxial layer and connects each of the second doped regions and the source electrode.

Preferably, a trench nitride layer is disposed between each of the first trench oxide layers and each of the first semiconductor layers, and the trench nitride layer is formed by silicon nitride.

Preferably, the first trench oxide layer is disposed between each of the trench nitride layers and each of the first semiconductor layers, and the trench nitride layer is positioned between the two first trench oxide layers.

Preferably, the two second trenches are disposed between two of the plurality of first trenches.

Preferably, the substrate is a silicon substrate, each of the first trench oxide layers and each of the second trench oxide layers are silicon dioxide, and each of the first semiconductor layers and each of the second semiconductor layers are polycrystalline silicon.

Preferably, each of the first trenches has a depth ranging from 7 microns to 15 microns.

Preferably, the epitaxial layer is n-type, each of the first doped regions is p-type, each of the first doped layers is p-type, and each of the second doped layers is n-type.

Preferably, the epitaxial layer is p-type, each of the first doped regions is n-type, each of the first doped layers is n-type, and each of the second doped layers is p-type.

Preferably, the high-voltage range is from 200 volts and 800 volts.

The high voltage metal-oxide-semiconductor field-effect transistor of the present invention may still operate normally under the high-voltage range because the depth of each of the trenches is designed at a micron level and the configuration involves a trench oxide layer and a trench nitride layer. The present invention may be applied to power circuits accepting high-voltage input, thus achieving the purpose of minimizing the size of power circuits.

DESCRIPTION OF THE PREFERRED EMBODIMENTS

The advantages, features, and technical methods of the present invention are to be explained in detail with reference to the exemplary embodiments and the figures for the purpose of being more easily to be understood. Moreover, the present invention may be realized in different forms, and should not be construed as being limited to the embodiments set forth herein. Conversely, for a person skilled in the art, the embodiments provided shall make the present invention convey the scope more thoroughly, comprehensively, and completely. In addition, the present invention shall be defined only by the appended claims.

Figure 1:
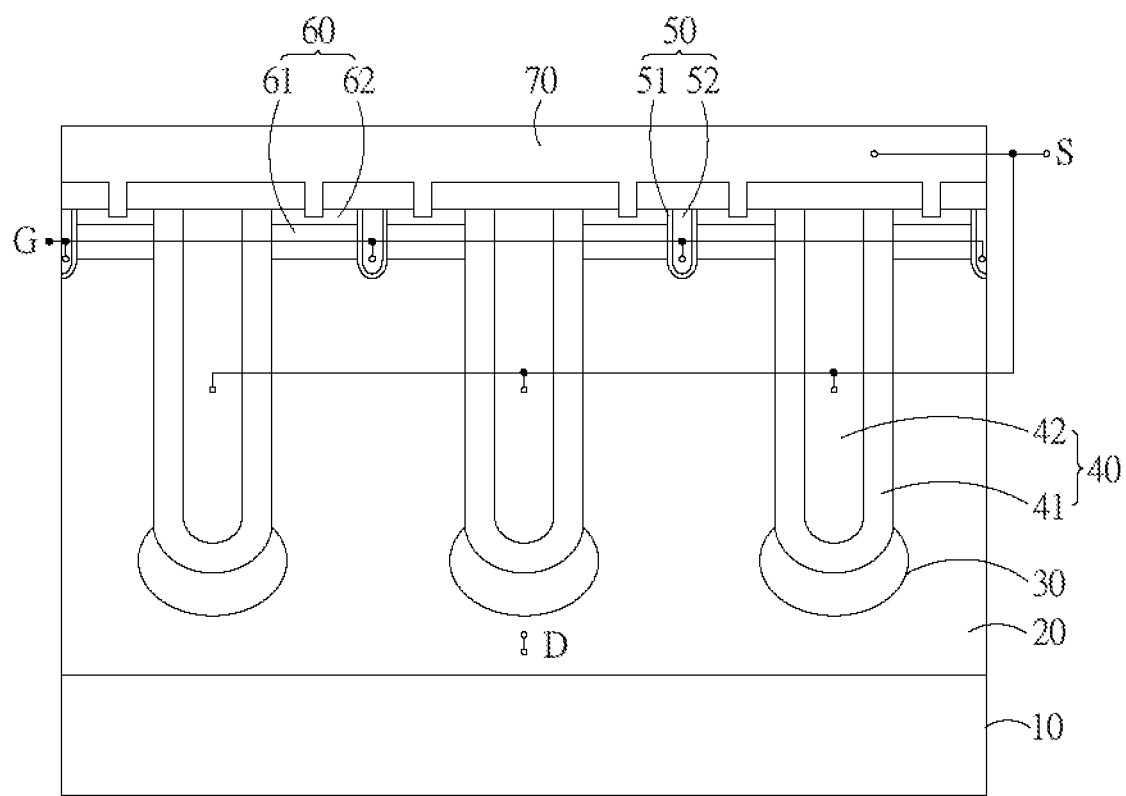
FIG. 1 depicts a structure diagram of the high-voltage metal-oxide-semiconductor field-effect transistor according to the first embodiment of the present invention.

FIG. 1 depicts a structure diagram of the high-voltage metal-oxide-semiconductor field-effect transistor according to the first embodiment of the present invention. In the embodiment, the high-voltage metal-oxide-semiconductor field-effect transistor of the present invention includes a substrate 10, an epitaxial layer 20, a plurality of first doped regions 30, a plurality of first trenches 40, a plurality of second trenches 50, a plurality of second doped regions 60, and a metal layer 70. The substrate 10 is a silicon substrate. The epitaxial layer 20, disposed on the substrate 10, is p-type to be used as a drain electrode D. The plurality of first doped regions 30, disposed in the epitaxial layer 20, is n-type. The plurality of first trenches 40 are respectively disposed on each of the first doped regions 30 in a space manner and positioned in the epitaxial layer 20. Each of the first trenches 40 has a first trench oxide layer 41 and a first semiconductor layer 42. Each of the first trench oxide layers 41 is formed on the bottom and the sidewall of each of the first trenches 40. Each of the first semiconductor layers 42 fills each of the first trenches 40 and respectively connects a source electrode S. Each of the first trench oxide layers 41 is formed by silicon dioxide, and each of the first semiconductor layers 42 is formed by polycrystalline silicon. The plurality of second trenches 50 are respectively disposed between the first trenches 40 and positioned in the epitaxial layer 20. Each of the second trenches 50 has a second trench oxide layer 51 and a second semiconductor layer 52. Each of the second trench oxide layers 51 is formed on the bottom and the sidewall of each of the second trenches 50. Each of the second semiconductor layers 52 fills each of second trenches 50 and respectively connects a gate electrode G. Each of the second trench oxide layers 51 is formed by silicon dioxide, and each of the second semiconductor layers 52 is formed by polycrystalline silicon. The plurality of second doped regions 60 are respectively disposed between each of the first trenches 40 and each of the second trenches 50 in a spaced manner and positioned in the epitaxial layer 20. Each of the second doped regions 60 includes a first doped layer 61, which is disposed upon the epitaxial layer 20, and a second doped layer 62 which is disposed on the first doped layer 61. The first doped layer 61 is n-type, and the second doped layer 62 is p-type. The metal layer 70 is disposed on the epitaxial layer 20 and connects each of the second doped regions 60 and the source electrode S.

In addition, each of the first trenches 40 has a depth ranging from 7 microns to 15 microns; each of the first trenches 40 has a first trench oxide layer 41 and each of the second trenches 50 has a second trench oxide layer 51; the first trench oxide layer 41 and the second trench oxide layer 51 are formed by silicon, thus having a fairly high resistance value and being a poor conductor of electricity. Therefore, the present invention may withstand a high-voltage range from 200 volts to 800 volts. It is also preferable to adjust the depth of each of the first trenches 40 according to the voltage specification requirements of the electronic elements, thus being applied to power circuits with the different voltage specification without being burned out due to high voltage. In the meantime, the design for the thickness of the first trench oxide layer 41 and the second trench oxide layer 51 is rather important. If the thickness of the first trench oxide layer 41 or the thickness of the second trench oxide layer 51 is too thin, the capability of withstanding high voltage becomes difficult due to the decrease in the value of resistance. Preferably, the first trench oxide layer 41 and the second trench oxide layer 51 have a thickness of 600 nm to 1000 nm. This may achieve the purpose of poorly conducting electricity, thus being able to withstand high voltage.

In addition, the plurality of first doped regions 30, the epitaxial layer 20, the plurality of first doped layers 61, and the plurality of second doped layers 62 have to be doped at a low concentration because doping with a high concentration may increase electric conductivity. If the plurality of first doped regions 30, the epitaxial layer 20, the plurality of first doped layers 61, and the plurality of second doped layers 62 are doped at a low concentration, elements may be burnt out at high voltage because of the increase in electric conductivity. Hence, the plurality of first doped regions 30, the epitaxial layer 20, the plurality of first doped layers 61, and the plurality of second doped layers 62 are required to be doped at a low concentration to reduce the electric conductivity thereof thus allowing the present invention to withstand high voltage. Preferably, each of the first doped regions 30 has a concentration from 1015 to 1017/cm3; the epitaxial layer 20 has a concentration from 1014-1016/cm3; the substrate 10 has a concentration of 1019/cm3. The concentration of the plurality of first doped regions 30 and the epitaxial layer 20 is approximately 1000 times different from the concentration of the substrate 10. When applying a high voltage to the present invention, the present invention may still operate normally because the plurality of first doped regions 30 and the epitaxial layer 20 at a low concentration do not conduct easily.

Figure 2:
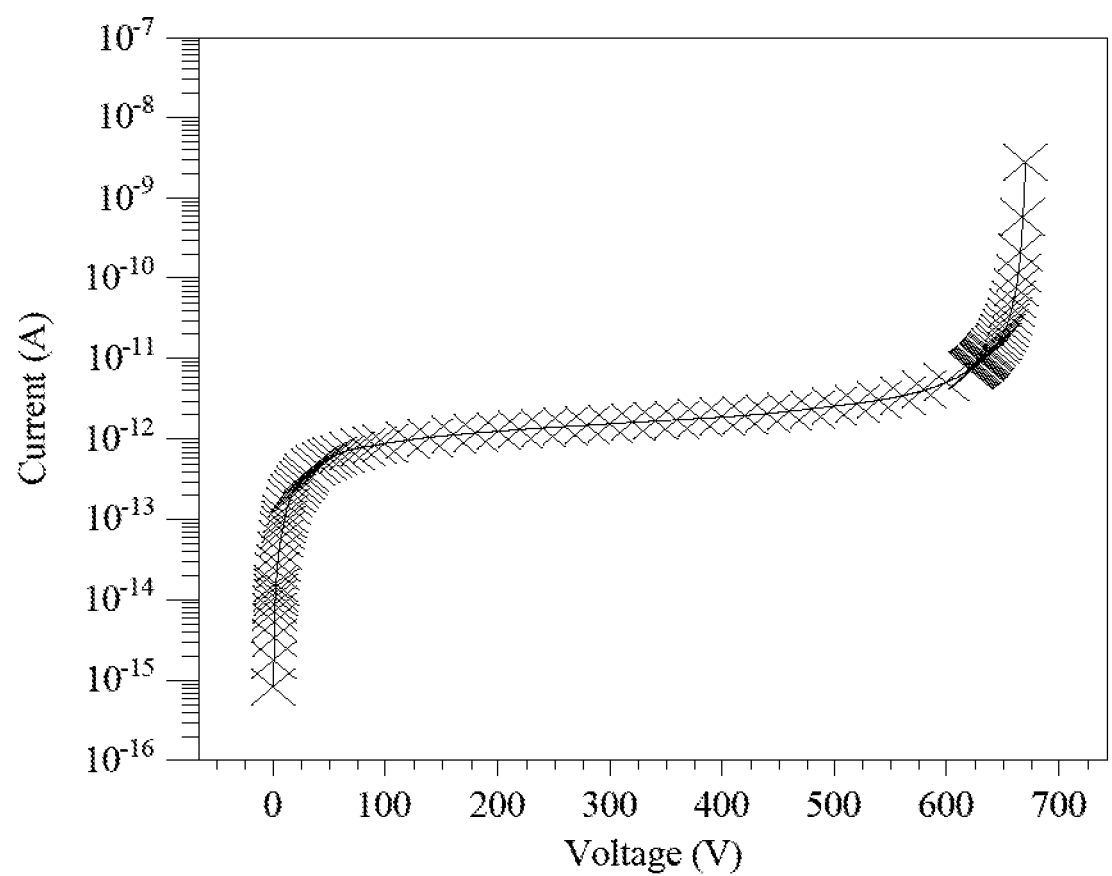
FIG. 2 depicts a voltage/current diagram of the high-voltage metal-oxide-semiconductor field-effect transistor according to the first embodiment of the present invention.

Please refer to FIG. 2, which depicts a voltage/current diagram of the high voltage metal-oxide-semiconductor field-effect transistor according to the first embodiment of the present invention. The condition for measurement is illustrated as follows. A high voltage is applied to the drain electrode D and a low voltage is applied to the gate electrode G and the source electrode S. Then, the gate electrode G and the source electrode S are short-circuited to make the voltage difference between the gate electrode G and the source electrode S become zero, leading to the voltage value of the drain electrode D being higher than that of the source electrode S. This makes the high-voltage metal-oxide-semiconductor field-effect transistor of the present invention in the state of reverse bias. Wherein, the voltage in the FIG. 2 is the voltage between the drain electrode D and the source electrode S; the current in the FIG. 2 is the current between the drain electrode D and the source electrode S; the reverse critical voltage is approximately 625 Volts, meaning that the present invention may still operate normally at 600 Volts or more. This further allows the present invention not to be burnt out at a high current.

Figure 3:
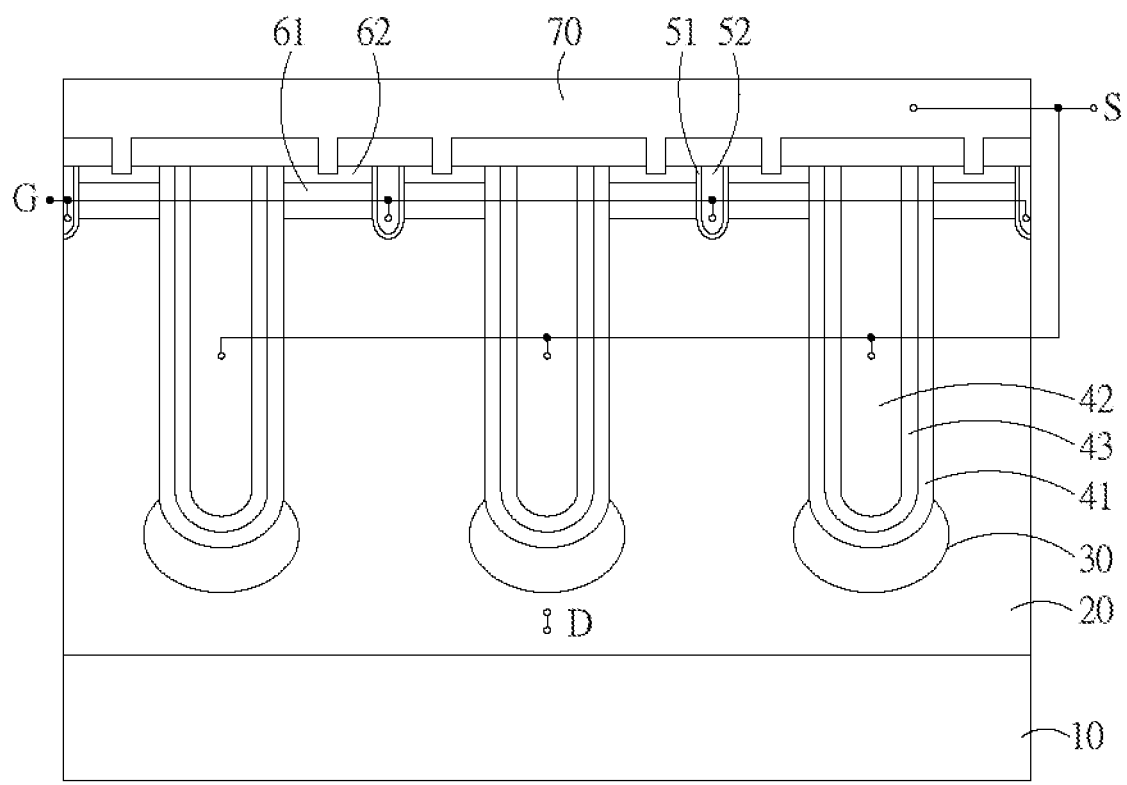
FIG. 3 depicts a structure diagram of the high-voltage metal-oxide-semiconductor field-effect transistor according to the second embodiment of the present invention.

Please refer to FIG. 3, which depicts a structure diagram of the high-voltage metal-oxide-semiconductor field-effect transistor according to the second embodiment of the present invention. In the embodiment, the configuration of the elements with the same symbols is similar to that described above, so the similar descriptions are not to be described herein.

As shown in FIG. 3, a trench nitride layer 43 is disposed between each of the first trench oxide layers 41 and each of the first semiconductor layers 42. The trench nitride layer 43 is formed by tantalum nitride. The stacking order is interchangeable between each of the trench nitride layers 43 and each of the first trench oxide layers 41. That is, the plurality of trench nitride layers 43 may be respectively deposited in the plurality of trenches 40. Next, the plurality of the first trench oxide layers 41 and the plurality of semiconductor layers 42 are deposited. Because silicon nitride materials also have a high resistance value, the combination of the plurality of first trench oxide layer 41 and the plurality of trench nitride layers 43 may be more capable of withstanding high voltage. In addition, the epitaxial layer 20 is p-type; each of the first doped layers 61 is n-type; each of the second doped layers 62 is p-type. According to actual requirements for application, it is preferable to change the configuration into: the epitaxial layer 20 is n-type; each of the first doped regions 30 is p-type; each of the first doped layers 61 is p-type; each of the second doped layers 62 is n-type.

Furthermore, the plurality of first trenches 40 are formed via reactive ion etching and exposure development. Then, the first trench oxide layer 41, the trench nitride layer 43, and the first semiconductor layer 42 are filled in each of the first trenches 40. This filling method makes the films of the first trench oxide layer 41, the trench nitride layer 43, and the first semiconductor layer 42 relatively uniform. This further makes the charge distribution between the first trench oxide layer 41, the trench nitride layer 43, and the first semiconductor layer 42 fairly average. The capacitance formed between the first trench oxide layer 41, the trench nitride layer 43, and the first semiconductor layer 42 is relatively stable.

Figure 4:
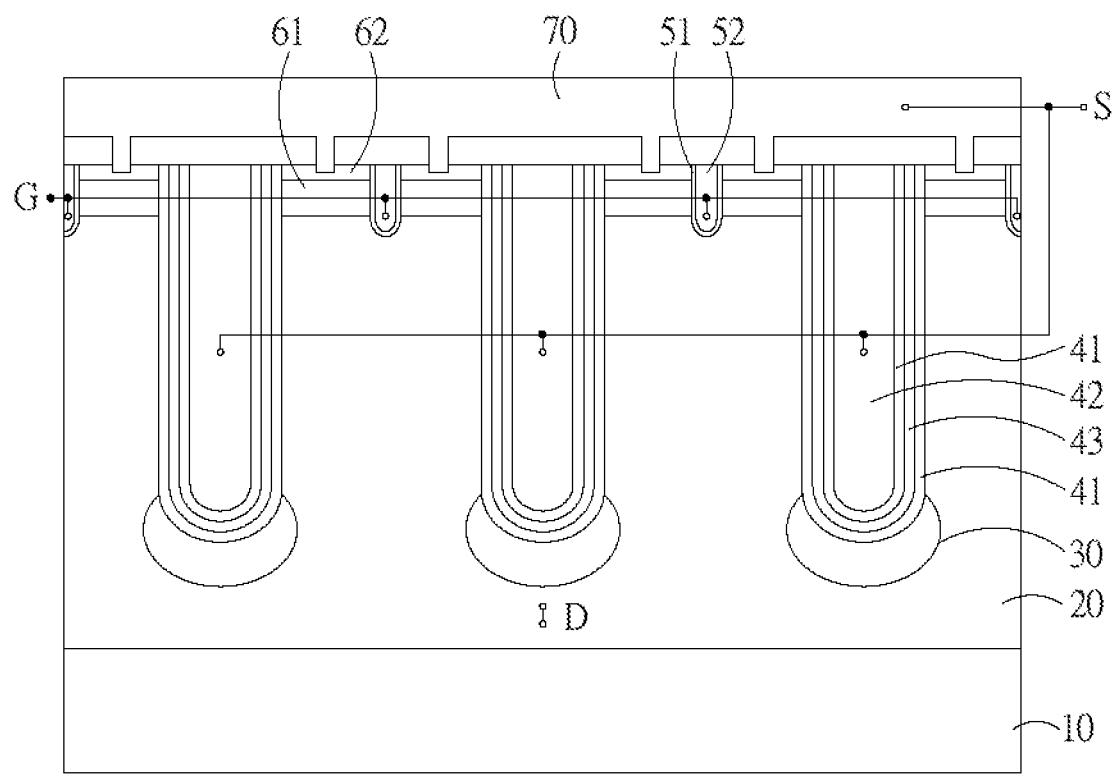
FIG. 4 depicts a structure diagram of the high-voltage metal-oxide-semiconductor field-effect transistor according to the third embodiment of the present invention.

Please refer to FIG. 4, which depicts a structure diagram of the high-voltage metal-oxide-semiconductor field-effect transistor according to the third embodiment of the present invention. In the embodiment, the configuration of the elements with the same symbols is similar to that described above, so the similar descriptions are not to be described herein.

As shown in FIG. 4, a first trench oxide layer 41 is disposed between each of the trench nitride layers 43 and each of the first semiconductor layers 42. The trench nitride layer 43 is positioned between the two first trench oxide layers 41. The resistance value is increased to withstand higher voltages owing to the configuration of the two first trench oxide layers 41 and the trench nitride layer 43. In addition, it is preferable to adjust the thickness of the two first trench oxide layers 41 and trench nitride layer 43 according to the voltage specification requirements for the electronic elements, thus conforming to power circuits with the different voltage specification without being burned out due to high voltage.

In addition, it is not required for the present invention to be connected to a series of metal-oxide-semiconductor field-effect transistors to withstand high voltage. Instead, the characteristic of withstanding high voltage may be achieved via adjusting the thickness and depth of the two first trench oxide layers 41 and the trench nitride layer 43. Hence, in terms of the application on a chip, since the present invention does not require connection to a series of metal-oxide-semiconductor field-effect transistors, the present invention designed on the area of the chip may be greatly minimized, and other electronic elements may be designed on the chip to make the chip more diverse in functionality.

Figure 5:
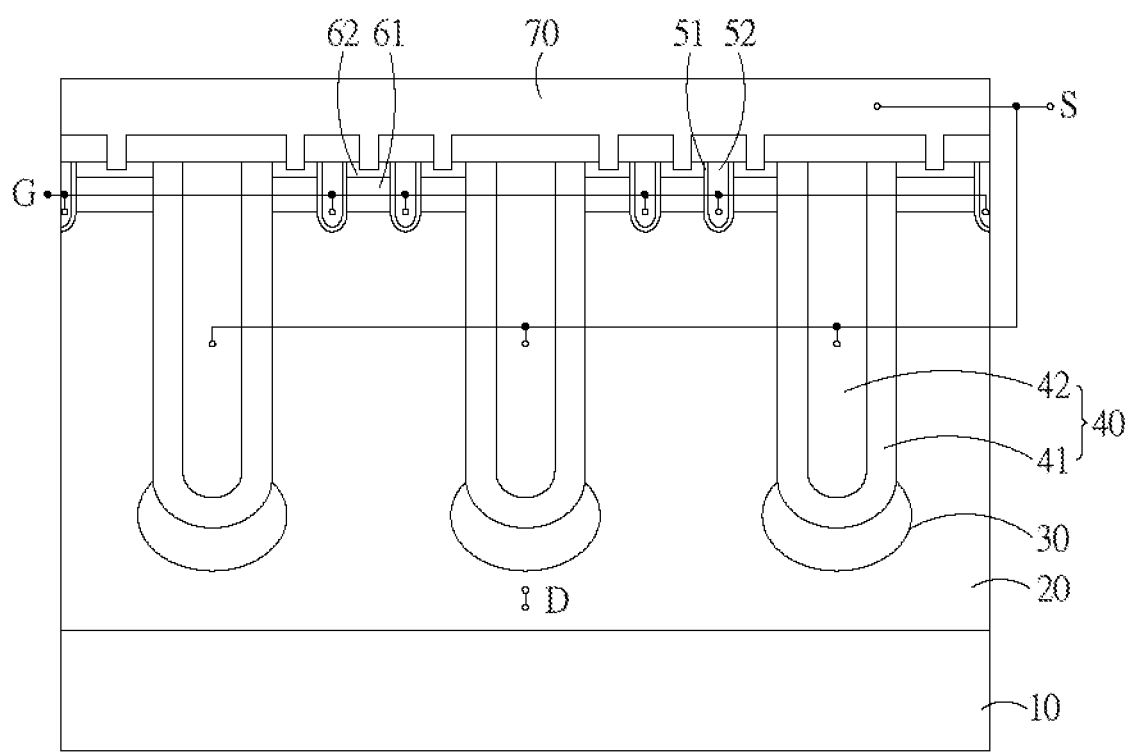
FIG. 5 depicts a structure diagram of the high-voltage metal-oxide-semiconductor field-effect transistor according to the four embodiment of the present invention.

FIG. 5 depicts a structure diagram of the high-voltage metal-oxide-semiconductor field-effect transistor according to the four embodiment of the present invention. In the embodiment, the configuration of the elements with the same symbols is similar to that described above, so the similar descriptions are not to be described herein.

As shown in FIG. 5, the two second trenches 50 are disposed between two of the plurality of first trenches 40. The density of the second trenches 50 may be increased to reduce the value of the on-state resistance of the present invention. Since each of the second trenches 50 has a second trench oxide layer 51 and a second semiconductor layer 52, immediately compensating the electric charge of the epitaxial layer 20 and stabilizing the electric charge distribution of the source electrode S may allow the drain electrode D and source electrode S to function more smoothly.

In conclusion, with the configuration of the plurality of first trench oxide layers 41 and the plurality of trench nitride layers 43, the high-voltage metal-oxide-semiconductor field-effect transistor of the present invention may still operate smoothly in a high-voltage range. Moreover, with the disposition of the plurality of second trench oxide layers 51 and the plurality of second semiconductor layers 52, the electric charge of the epitaxial layer 20 may be compensated immediately to make the source electrode S and the drain electrode D function smoothly. In short, the high voltage metal-oxide-semiconductor field-effect transistor of the present invention has the advantages as described above, the purpose of smoothly functioning at a high voltage may be attained by using the disposition of the plurality of first trench oxide layers 41 and the plurality of trench nitride layers 43.

The above description is merely illustrative rather than restrictive. Any equivalent modification or alteration without departing from the spirit and scope of the present invention should be included in the appended claims.

What is claimed is:

1. A high-voltage metal-oxide-semiconductor field-effect transistor for a high-voltage range, comprising:
   a substrate;
   an epitaxial layer disposed on the substrate to be used as a drain electrode;
   a plurality of first doped regions disposed in the epitaxial layer;
   a plurality of first trenches respectively disposed on each of the first doped regions in a spaced manner and positioned in the epitaxial layer, wherein each of the first trenches has a first trench oxide layer and a first semiconductor layer, each of the first trench oxide layers is formed on a bottom and a sidewall of each of the first trenches, and each of the first semiconductor layers fills each of the first trenches and respectively connects a source electrode;
   a plurality of second trenches respectively disposed between the first trenches in a spaced manner and positioned in the epitaxial layer, wherein each of the second trenches has a second trench oxide layer and a second semiconductor layer, each of the second trench oxide layers is formed on a bottom and a sidewall of each of the second trenches, and each of the second semiconductor layers fills each of second trenches and respectively connects a gate electrode;

a plurality of second doped regions, wherein each of the second doped regions and each of the first doped regions are disposed away from each other, respectively disposed between each of the first trenches and each of the second trenches in a spaced manner, and positioned in the epitaxial layer; each of the second doped regions comprises a first doped layer and a second doped layer disposed on the first doped layer; and a metal layer disposed on the epitaxial layer and connected to each of the second doped regions and the source electrode.

2. The high-voltage metal-oxide-semiconductor field-effect transistor according to claim 1, wherein a trench nitride layer is disposed between each of the first trench oxide layers and each of the first semiconductor layers, and the trench nitride layer is formed by silicon nitride.

3. The high-voltage metal-oxide-semiconductor field-effect transistor according to claim 2, wherein the first trench oxide layer is disposed between each of the trench nitride layers and each of the first semiconductor layers, and the trench nitride layer is positioned between the two first trench oxide layers.

4. The high-voltage metal-oxide-semiconductor field-effect transistor according to claim 1, wherein two of the second trenches are disposed between two of the plurality of first trenches.

5. The high-voltage metal-oxide-semiconductor field-effect transistor according to claim 1, wherein the substrate is a silicon substrate, each of the first trench oxide layers and each of the second trench oxide layers are silicon dioxide, and each of the first semiconductor layers and each of the second semiconductor layers are polycrystalline silicon.

6. The high-voltage metal-oxide-semiconductor field-effect transistor according to claim 1, wherein each of the first trenches has a depth ranging from 7 microns to 15 microns.

7. The high-voltage metal-oxide-semiconductor field-effect transistor according to claim 1, wherein the epitaxial layer is n-type, each of the first doped regions is p-type, each of the first doped layers is p-type, and each of the second doped layers is n-type.

8. The high-voltage metal-oxide-semiconductor field-effect transistor according to claim 1, wherein the epitaxial layer is p-type, each of the first doped regions is n-type, each of the first doped layers is n-type, and each of the second doped layers is p-type.

9. The high-voltage metal-oxide-semiconductor field-effect transistor according to claim 1, wherein the high-voltage range is from 200 volts and 800 volts.

* * * * *